(12) United States Patent
Lin et al.

(10) Patent No.: US 11,646,195 B2
(45) Date of Patent: May 9, 2023

(54) METHOD FOR FABRICATING SEMICONDUCTOR DEVICE HAVING ETCH RESISTIVE NITRIDE LAYER

(71) Applicant: NANYA TECHNOLOGY CORPORATION, New Taipei (TW)

(72) Inventors: Shih-En Lin, New Taipei (TW); Wei-Zeng Wu, New Taipei (TW); Wei-Lun Zeng, Taoyuan (TW); Wen-Chieh Wu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 234 days.

(21) Appl. No.: 17/077,685

(22) Filed: Oct. 22, 2020

(65) Prior Publication Data
US 2022/0130657 A1    Apr. 28, 2022

(51) Int. Cl.
*H01L 21/02*    (2006.01)
*C23C 16/44*    (2006.01)
(Continued)

(52) U.S. Cl.
CPC ...... *H01L 21/0217* (2013.01); *C23C 16/4408* (2013.01); *C23C 16/45536* (2013.01); *C23C 16/52* (2013.01); *H01L 21/0228* (2013.01)

(58) Field of Classification Search
None
See application file for complete search history.

(56) References Cited

U.S. PATENT DOCUMENTS

2018/0342385 A1* 11/2018 Tonegawa ......... C23C 16/45534
2020/0006557 A1*  1/2020 Ko .................... H01L 21/31155

FOREIGN PATENT DOCUMENTS

CN    1841676 A    10/2006

* cited by examiner

*Primary Examiner* — Asok K Sarkar
(74) *Attorney, Agent, or Firm* — Muncy, Geissler, Olds & Lowe, P.C.

(57) ABSTRACT

The present application discloses a method for fabricating the semiconductor device including providing a substrate in a reaction chamber, forming an untreated silicon nitride film on the substrate, and forming a treated silicon nitride film on the untreated silicon nitride film. Forming the untreated silicon nitride film includes the steps of: (a) supplying a first silicon precursor into the reaction chamber, thereby allowing chemical species from the first silicon precursor to be adsorbed on the substrate, and (b) supplying a first nitrogen precursor into the reaction chamber, thereby nitriding the chemical species to deposit resultant silicon nitride. The step (a) and the step (b) are sequentially and repeatedly performed to form the untreated silicon nitride film. Forming the treated silicon nitride film includes the steps of: (c) supplying a second silicon precursor into the reaction chamber, thereby allowing chemical species from the second silicon precursor to be adsorbed on the untreated silicon nitride film, (d) performing a first hydrogen radical purging by supplying hydrogen radicals into the reaction chamber to reduce impurities in the chemical species from the second silicon precursor, and (e) supplying a second nitrogen precursor into the reaction chamber, thereby nitriding the chemical species from the second silicon precursor to deposit resultant silicon nitride. The step (c), the step (d), and the step (e) are sequentially and repeatedly performed to form the treated silicon nitride film. The untreated silicon nitride film and the treated silicon nitride film together form a silicon nitride layer.

20 Claims, 15 Drawing Sheets

(51) Int. Cl.
*C23C 16/52* (2006.01)
*C23C 16/455* (2006.01)

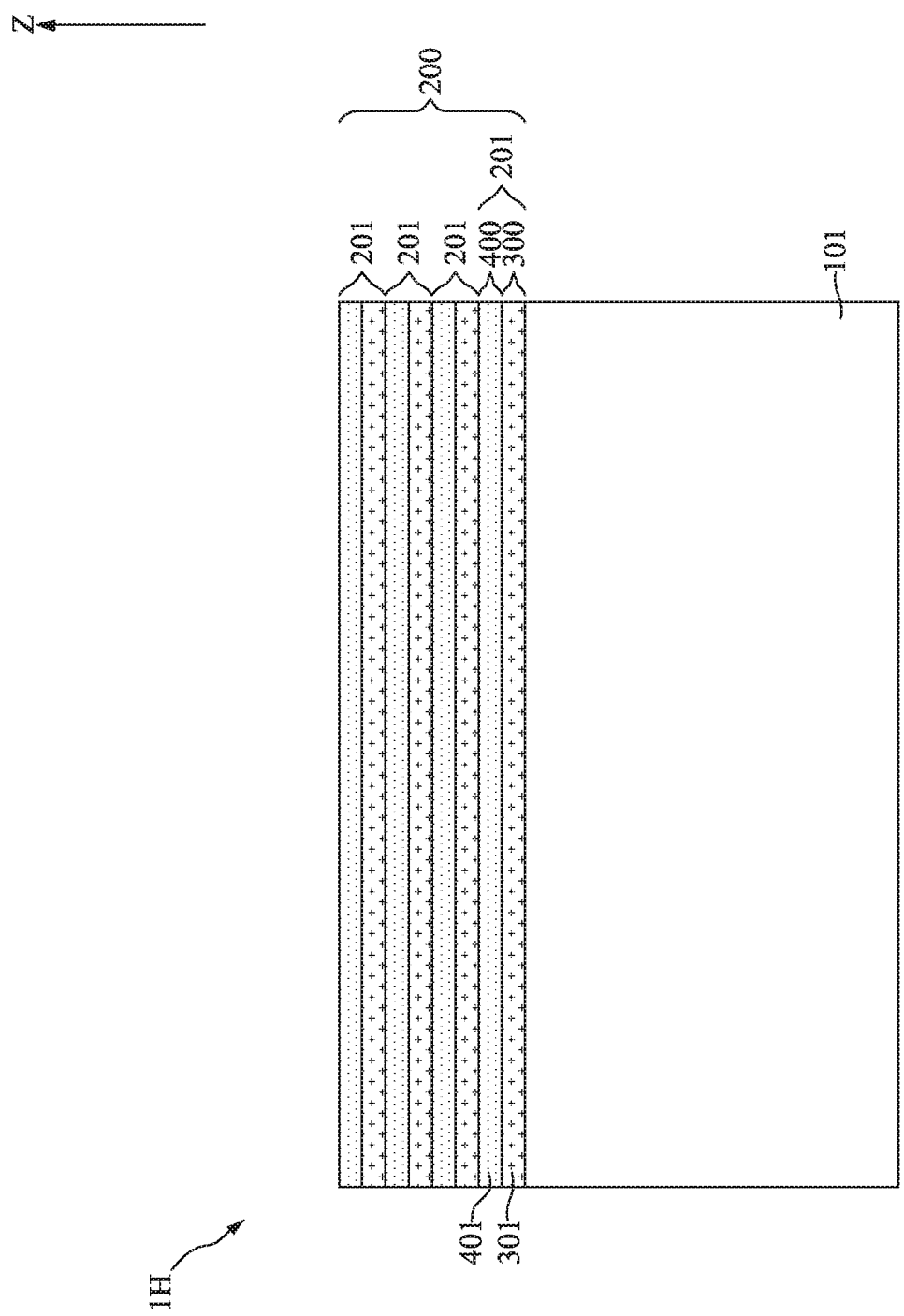

METHOD FOR FABRICATING SEMICONDUCTOR DEVICE HAVING ETCH RESISTIVE NITRIDE LAYER

TECHNICAL FIELD

The present disclosure relates to a method for fabricating a semiconductor device, and more particularly, to a method for fabricating a semiconductor device having etch resistive nitride layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for fabricating a semiconductor device including providing a substrate in a reaction chamber, forming an untreated silicon nitride film on the substrate, and forming a treated silicon nitride film on the untreated silicon nitride film. Forming the untreated silicon nitride film includes the steps of: (a) supplying a first silicon precursor into the reaction chamber, thereby allowing chemical species from the first silicon precursor to be adsorbed on the substrate, and (b) supplying a first nitrogen precursor into the reaction chamber, thereby nitriding the chemical species to deposit resultant silicon nitride on the substrate. The step (a) and the step (b) are sequentially and repeatedly performed to form the untreated silicon nitride film. Forming the treated silicon nitride film includes the steps of: (c) supplying a second silicon precursor into the reaction chamber, thereby allowing chemical species from the second silicon precursor to be adsorbed on the untreated silicon nitride film, (d) performing a first hydrogen radical purging by supplying hydrogen radicals into the reaction chamber to reduce impurities in the chemical species from the second silicon precursor, and (e) supplying a second nitrogen precursor into the reaction chamber, thereby nitriding the chemical species from the second silicon precursor to deposit resultant silicon nitride on the untreated silicon nitride film. The step (c), the step (d), and the step (e) are sequentially and repeatedly performed to form the treated silicon nitride film. The untreated silicon nitride film and the treated silicon nitride film together form a silicon nitride layer.

In some embodiments, the first silicon precursor and the second silicon precursor are dichlorosilane.

In some embodiments, the first nitrogen precursor and the second nitrogen precursor are ammonia gas.

In some embodiments, the hydrogen radicals in step (d) are generated in a plasma generating unit by supplying hydrogen gas thereto.

In some embodiments, the step (d) includes a stabilizing stage, a flowing stage, and a vacuuming stage.

In some embodiments, a process pressure in the reaction chamber is between about 40 Pa and about 100 Pa during the flowing stage of the step (d).

In some embodiments, a process pressure in the plasma generating unit is between about 70 Pa and about 400 Pa during the flowing stage of step (d).

In some embodiments, a flow rate of the hydrogen radicals is between about 0.5 slm and about 5 slm during the flowing stage of the step (d).

In some embodiments, a process frequency of the plasma generating unit is between about 10.00 MHz and about 15.00 MHz during the flowing stage of the step (d).

In some embodiments, forming the treated silicon nitride film further includes a step (f) performing a second hydrogen radical purging by supplying hydrogen radicals into the reaction chamber.

Another aspect of the present disclosure provides a method for fabricating a semiconductor device including. providing a substrate in a reaction chamber, and forming a silicon nitride layer on the substrate by sequentially and repeatedly forming an untreated silicon nitride film and a treated silicon nitride film for plural times. Forming the untreated silicon nitride film and the treated silicon nitride film includes the steps of: (a) supplying a first silicon precursor into the reaction chamber, thereby allowing chemical species from the first silicon precursor to be adsorbed on the substrate, (b) supplying a first nitrogen precursor into the reaction chamber, thereby nitriding the chemical species to deposit resultant silicon nitride on the substrate, (c) sequentially and repeatedly performing the step (a) and the step (b) to form the untreated silicon nitride film, (d) supplying a second silicon precursor into the reaction chamber, thereby allowing chemical species from the second silicon precursor to be adsorbed on the untreated silicon nitride film, (e) performing a first hydrogen radical purging by supplying hydrogen radicals into the reaction chamber to reduce impurities in the chemical species from the second silicon precursor, (f) supplying a second nitrogen precursor into the reaction chamber, thereby nitriding the chemical species from the second silicon precursor to deposit resultant silicon nitride on the untreated silicon nitride film, and (g) sequentially and repeatedly performing the step (d), the step (e), and the step (f) to form the treated silicon nitride film.

In some embodiments, the first silicon precursor and the second silicon precursor are dichlorosilane.

In some embodiments, the first nitrogen precursor and the second nitrogen precursor are ammonia gas.

In some embodiments, the hydrogen radicals in step (e) are generated in a plasma generating unit by supplying hydrogen gas thereto.

In some embodiments, the step (a) includes a stabilizing stage, a flowing stage, and a purging and vacuuming stage (501, FIG. 3).

In some embodiments, a process temperature is between 200° C. and about 550° C. during the flowing stage of the step (a).

In some embodiments, a flow rate of the first silicon precursor is between about 1 slm and about 5 slm during the flowing stage of the step (a).

In some embodiments, a process pressure is between about 400 Pa and about 1200 Pa during the flowing stage of the step (a).

In some embodiments, the step (b) includes a stabilizing stage, a flowing stage, and a purging and vacuuming stage.

In some embodiments, a process frequency of the plasma generating unit is between about 10.00 MHz and about 15.00 MHz during the flowing stage of the step (b).

Due to the design of the semiconductor device of the present disclosure, the impurity concentration of the resultant silicon nitride layer may be reduced. Accordingly, the wet etch resistance property of the silicon nitride layer may be improved. As a result, the yield, the quality, and the reliability of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 10 to 15 illustrate, in schematic cross-sectional view diagrams, semiconductor device in accordance with some embodiments of the present disclosure.

DETAILED DESCRIPTION

Figure 1:
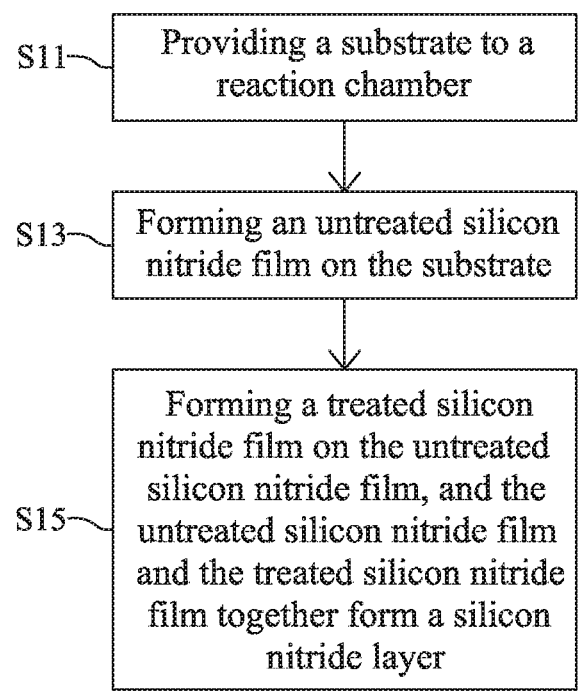
FIG. 1 illustrates, in a flowchart diagram form, a method for fabricating a semiconductor device 1A in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
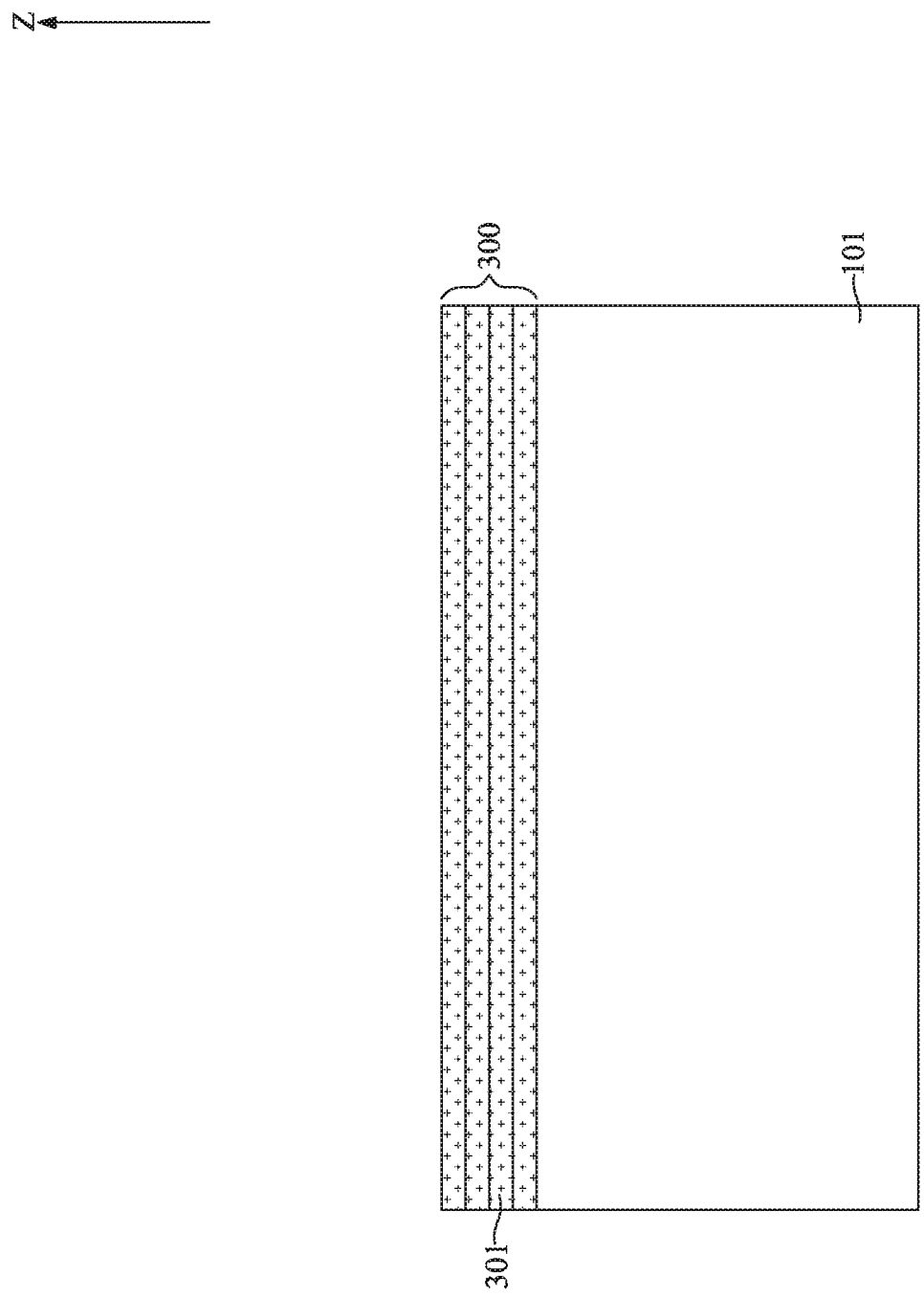
FIG. 2 illustrates, in a schematic cross-sectional view diagram, part of a flow for fabricating the semiconductor device in accordance with one embodiment of the present disclosure.
Figure 3:
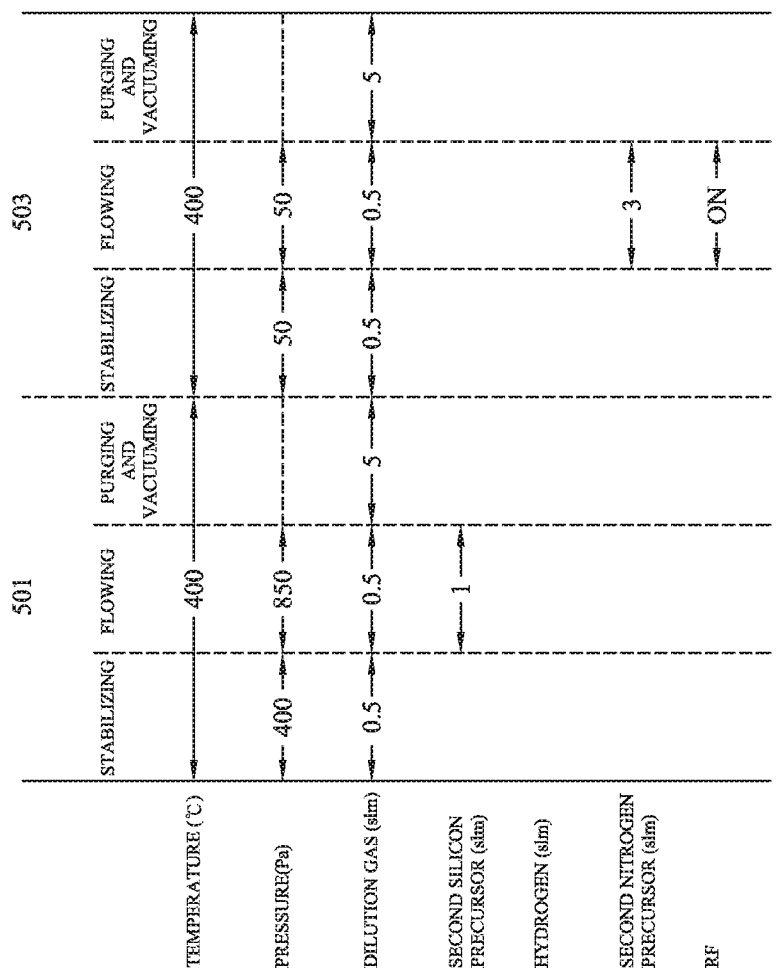
FIG. 3 is a chart showing an example of process conditions for forming an untreated silicon nitride film in accordance with one embodiment of the present disclosure.

FIG. 1 illustrates, in a flowchart diagram form, a method 10 for fabricating a semiconductor device 1A in accordance with one embodiment of the present disclosure. FIG. 2 illustrates, in a schematic cross-sectional view diagram, part of a flow for fabricating the semiconductor device 1A in accordance with one embodiment of the present disclosure. FIG. 3 is a chart showing an example of process conditions for forming an untreated silicon nitride film 300 in accordance with one embodiment of the present disclosure.

With reference to FIGS. 1 and 2, at step S11, a substrate 101 may be provided to a reaction chamber.

With reference to FIG. 2, in some embodiments, the substrate 101 may include, but is not limited to, a semiconductor wafer, such as crystalline silicon (e.g., Si<100> or Si<111>), silicon oxide, strained silicon, silicon on insulator, silicon germanium, a doped or an undoped polysilicon wafer, or the like. In some embodiments, the top surface of the substrate 101 may include regions of bare silicon, barrier material, low-k or high-k dielectric material, conductive material, or the like. In some embodiments, the top surface of the substrate 101 may include trenches, openings, holes, recesses, or the like.

In some embodiments, the substrate 101 may be pretreated by selectively performing processes such as polishing, annealing, baking, etching, reduction, oxidation, halogenation, hydroxylation, or the like.

With reference to FIGS. 1 to 3, at step S13, an untreated silicon nitride film 300 may be formed on the substrate 101.

With reference to FIGS. 2 and 3, the untreated silicon nitride film 300 may be formed by a first deposition process. The first deposition may be an atomic layer deposition process. Generally, the atomic layer deposition process alternately supplies two (or more) different source gases one by one onto a process object under predetermined process conditions, so that chemical species from the source gases are adsorbed to the process object at a single atomic layer level, and are deposited on the process object through surface reactions. For instance, a first gas and a second source gas are alternately suppled to a process object to flow along the surface thereof, thereby molecules (or chemical species) contained in the first source gas adsorb to the surface of the process object, and molecules (or chemical species) contained in the second source gas react with the adsorbed molecules originated from the first source gas to form a film of a thickness of a single molecule level. The above process steps are performed repeatedly, so that a high-quality film may be formed on the process object.

Specifically, the first deposition process may include a first silicon precursor supplying step 501 and a first nitrogen precursor supplying step 503 performed sequentially. In the first silicon precursor supplying step 501, a first silicon precursor may be supplied to the reaction chamber and the chemical species from the first silicon precursor may be adsorbed to the top surface of the substrate 101 at a single atomic layer level. In the first nitrogen precursor supplying step 503, a first nitrogen precursor may be activated and supplied to the reaction chamber and the chemical species contained in the first nitrogen precursor may react with the adsorbed chemical species originated from the first silicon precursor to form an untreated silicon nitride sub-film 301 of a thickness of a single molecule level. The untreated silicon nitride sub-film 301 may be formed on the top surface of the substrate 101.

Specifically, the first silicon precursor supplying step 501 may include a stabilizing stage, a flowing stage, and a purging and vacuuming stage.

With reference to FIGS. 2 and 3, in the stabilizing stage of the first silicon precursor supplying step 501, a dilution gas (or a carrier gas) such as nitrogen gas may be supplied to the reaction chamber. A flow rate of the dilution gas may be between about 0.3 slm (standard liter per minute) and about 0.7 slm. For example, in the embodiment depicted, the flow rate of the dilution gas may be 0.5 slm. A process temperature of the stabilizing stage may be between about 25° C. and about 700° C., between about 50° C. and about 600° C., between about 100° C. and about 500° C., between about 200° C. and about 450° C., or between about 350° C. and about 425° C. For example, in the embodiment depicted, the process temperature of the stabilizing stage may be 400° C. A process pressure of the stabilizing stage may be between about 200 Pa and about 600 Pa, between about 300 Pa and about 500 Pa, or between about 350 Pa and about 450 Pa. For example, the in the present embodiment, the process pressure of the stabilizing stage may be 400 Pa.

With reference to FIGS. 2 and 3, in the flowing stage of the first silicon precursor supplying step 501, the first silicon precursor may be supplied to the reaction chamber while the dilution gas is suppling. The chemical species from the first silicon precursor may be adsorbed to the top surface of the substrate 101 at a single atomic layer level. In some embodiments, the first silicon precursor may include a halide, such as iodine (I) or chlorine (Cl). In the embodiment depicted, the first silicon precursor may be, for example, dichlorosilane. The reaction between the first silicon precursor and the substrate 101 may be shown in Formula 1. In some embodiments, the first silicon precursor may include, for example, silicon tetrachloride, trichlorosilane, dichlorosilane, or hexachlorodisilane. In some embodiments, the first silicon precursor may include, for example, silicon tetraiodide, triododsilane, diiodosilane, iodosilane, disilicon hexaiodide, trisilicon octaiodide, $H_2Si_2I_4$, $H_3Si_2I_3$, $H_4Si_2I_2$, $H_5Si_2I$, or $HSi_2I_5$. In some embodiments, the first silicon precursor may include one of triododsilane, diiodosilane, iodosilane, $H_2Si_2I_4$, $H_4Si_2I_2$, and $H_5Si_2I$. In some embodiments, the first silicon precursor may include two, three, four, five or six of triododsilane, diiodosilane, iodosilane, $H_2Si_2I_4$, $H_4Si_2I_2$, and $H_5Si_2I$, including any combinations thereof.

$$—NH_2+SiH_2Cl_2 \rightarrow —NH—SiH_2Cl+HCl \uparrow \quad \text{(Formula 1)}$$

With reference to FIGS. 2 and 3, in the flowing stage of the first silicon precursor supplying step 501, a flow rate of the first silicon precursor may be between about 1 slm and about 5 slm or between about 3 slm and about 4.5 slm. For example, in the embodiment depicted, the flow rate of the first silicon precursor may be 1 slm. If the flow rate of the first silicon precursor is lower than 1 slm, the amount of the first silicon precursor may be not sufficient to supply to nitrogen atoms on the top surface of the substrate 101. If the flow rate of the first silicon precursor is greater than 5 slm, an amount of the first silicon precursor may not react with nitrogen atoms on the top surface of the substrate 101. A flow rate of the dilution gas may be between about 0.3 slm and about 0.7 slm. For example, in the embodiment depicted, the flow rate of the dilution gas may be 0.5 slm.

With reference to FIGS. 2 and 3, in the flowing stage of the first silicon precursor supplying step 501, a process temperature of the flowing stage may be between about 200° C. and about 550° C. For example, in the embodiment depicted, the process temperature of the flowing stage may be 400° C. If the process temperature is lower than 200° C., the chemical species from the first silicon precursor may not be adsorbed to the top surface of the substrate 101. If the process temperature is greater than 550° C., the reliability of transistor in the substrate 101 may be affected and the thicknesses of resultant silicon nitride layer in zone 3 may be shallower. In other words, the thickness uniformity of the resultant silicon nitride layer may be worse. In some embodiments, the process temperature of the flowing stage may be between about 390° C. and about 410° C. By using aforementioned temperature range, the deposition rate may be increased, and various characteristics, such as thickness uniformity, wet etch resistance property and film stress, of the resultant silicon nitride layer may be improved.

With reference to FIGS. 2 and 3, in the flowing stage of the first silicon precursor supplying step 501, a process pressure of the flowing stage may be between about 400 Pa and about 1200 Pa, between about 600 Pa and about 1100 Pa, or between about 800 Pa and about 1000 Pa. For example, the in the present embodiment, the process pressure of the flowing stage may be 850 Pa. By using aforementioned pressure range, the reaction rate between nitrogen atoms and first silicon precursor may be increased and the pressure may be readily regulated.

With reference to FIGS. 2 and 3, in the purging and vacuuming stage of the first silicon precursor supplying step 501, the supply of the first silicon precursor may be stopped. A flow rate of the dilution gas may be increased to purge the reaction chamber. For example, the flow rate of the dilution gas may be between about 3 slm and about 7 slm. In the embodiment depicted, the flow rate of the dilution gas may be 5 slm.

Specifically, the first nitrogen precursor supplying step 503 may include a stabilizing stage, a flowing stage, and a purging and vacuuming stage.

With reference to FIGS. 2 and 3, in the stabilizing stage of the first nitrogen precursor supplying step 503, a dilution gas such as nitrogen gas may be supplied to the reaction chamber. A flow rate of the dilution gas may be between about 0.3 slm and about 0.7 slm. For example, in the embodiment depicted, the flow rate of the dilution gas may be 0.5 slm. A process temperature of the stabilizing stage may be between about 25° C. and about 700° C., between about 50° C. and about 600° C., between about 100° C. and about 500° C., between about 200° C. and about 450° C., or between about 350° C. and about 425° C. For example, in the embodiment depicted, the process temperature of the stabilizing stage may be 400° C. A process pressure of the stabilizing stage may be between about 10 Pa and about 70 Pa, between about 20 Pa and about 60 Pa, or between about 30 Pa and about 50 Pa. For example, the in the present embodiment, the process pressure of the stabilizing stage may be 50 Pa.

With reference to FIGS. 2 and 3, in the flowing stage of the first nitrogen precursor supplying step 503, the first nitrogen precursor may be activated in a plasma generating unit and then supplied to the reaction chamber while the dilution gas is suppling. The chemical species contained in the activated first nitrogen precursor may react with the adsorbed chemical species originated from the first silicon precursor to form the untreated silicon nitride sub-film 301 on the top surface of the substrate 101. The first nitrogen precursor may be, for example, ammonia gas.

With reference to FIGS. 2 and 3, in the flowing stage of the first nitrogen precursor supplying step 503, a radio frequency (RF) in the plasma generating unit may be turned on to activate the first nitrogen precursor. A radio frequency power of the flowing stage may be between about 50 W and about 1000 W or between about 100 W and about 300 W. If the radio frequency power of the flowing stage is greater than 1000 W, the quarts walls of the plasma generating unit may be damaged. A radio frequency power density of the flowing stage may be between about 0.02 W/cm$^2$ and about 2.0 W/cm$^2$ or between about 0.05 W/cm$^2$ and about 1.5 W/cm$^2$. The process frequency of the plasma generating unit may be between about 10.00 MHz and about 15.00 MHz. For example, in the embodiment depicted, the process frequency of the plasma generating unit in the flowing stage may be 13.56 MHz. In the embodiment depicted, the activated first nitrogen precursors may be ammonia radicals (NH$_3$*). The activated first nitrogen precursor may be supplied to the reaction chamber in the form of plasma.

With reference to FIGS. 2 and 3, in the flowing stage of the first nitrogen precursor supplying step 503, a flow rate of the activated first nitrogen precursor may be between about 0.5 slm and about 5 slm or between 3 slm and about 5 slm. By using the aforementioned flow rate range, the plasma of activated first nitrogen precursor may be readily generated and the amount of the activated first nitrogen precursor may be sufficient to react with the adsorbed chemical species originated from the first silicon precursor. In the embodiment depicted, the flow rate of the activated first nitrogen precursor may be, for example, 3 slm. It should be noted that the dilution gas may be still supplied in the flowing stage and a flow rate of the dilution gas may be between about 0.3 slm and about 0.7 slm. For example, in the embodiment depicted, the flow rate of the dilution gas may be still 0.5 slm.

With reference to FIGS. 2 and 3, in the flowing stage of the first nitrogen precursor supplying step 503, a process pressure in the reaction chamber may be between about 40 Pa and about 100 Pa or between about 50 Pa and about 70 Pa. For example, in the embodiment depicted, the process pressure in the reaction chamber may be 50 Pa. A process pressure in the plasma generating unit may be between about 70 Pa and about 600 Pa or between about 280 Pa and about 330 Pa. By using the aforementioned process pressure range in the plasma generating unit, the plasma of activated first nitrogen precursor may be readily generated and the amount of the activated first nitrogen precursor may be sufficient to react with the adsorbed chemical species originated from the first silicon precursor.

With reference to FIGS. 2 and 3, in the flowing stage of the first nitrogen precursor supplying step 503, reactions between the activated first nitrogen precursor and the adsorbed chemical species originated from the first silicon precursor may be shown in Formula 2 and Formula 3. The untreated silicon nitride sub-film 301 consisting of —NH—SiH$_2$(NH$_2$) and —NH—SiHCl(NH$_2$) may be formed after the surface reactions. It should be noted that, the presence of the impurities such as chlorine in the untreated silicon nitride sub-film 301 may have adverse effects to some properties, such as film stress and wet etch resistance property, of the resultant untreated silicon nitride film 300 as will be illustrated later

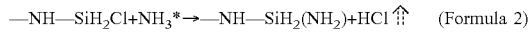  (Formula 2)

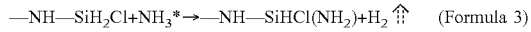  (Formula 3)

With reference to FIGS. 2 and 3, in the purging and vacuuming stage of the first nitrogen precursor supplying step 503, the supply of the first nitrogen precursor may be stopped and the radio frequency of the plasma generating unit may be turned off. A flow rate of the dilution gas may be increased to purge the reaction chamber. For example, the flow rate of the dilution gas may be between about 3 slm and about 7 slm. In the embodiment depicted, the flow rate of the dilution gas may be 5 slm.

After the first deposition process, one layer of the untreated silicon nitride sub-film 301 may be formed. The first deposition process may be repeated for plural times (only shown four times for clarity) to form layers of the untreated silicon nitride sub-film 301 of desired thickness. The layers of the untreated silicon nitride sub-film 301 together form the untreated silicon nitride film 300. In some embodiments, the repeat times of the first deposition process may be between about 20 and about 60, between about 30 and about 50, or between about 34 and about 40.

Figure 4:
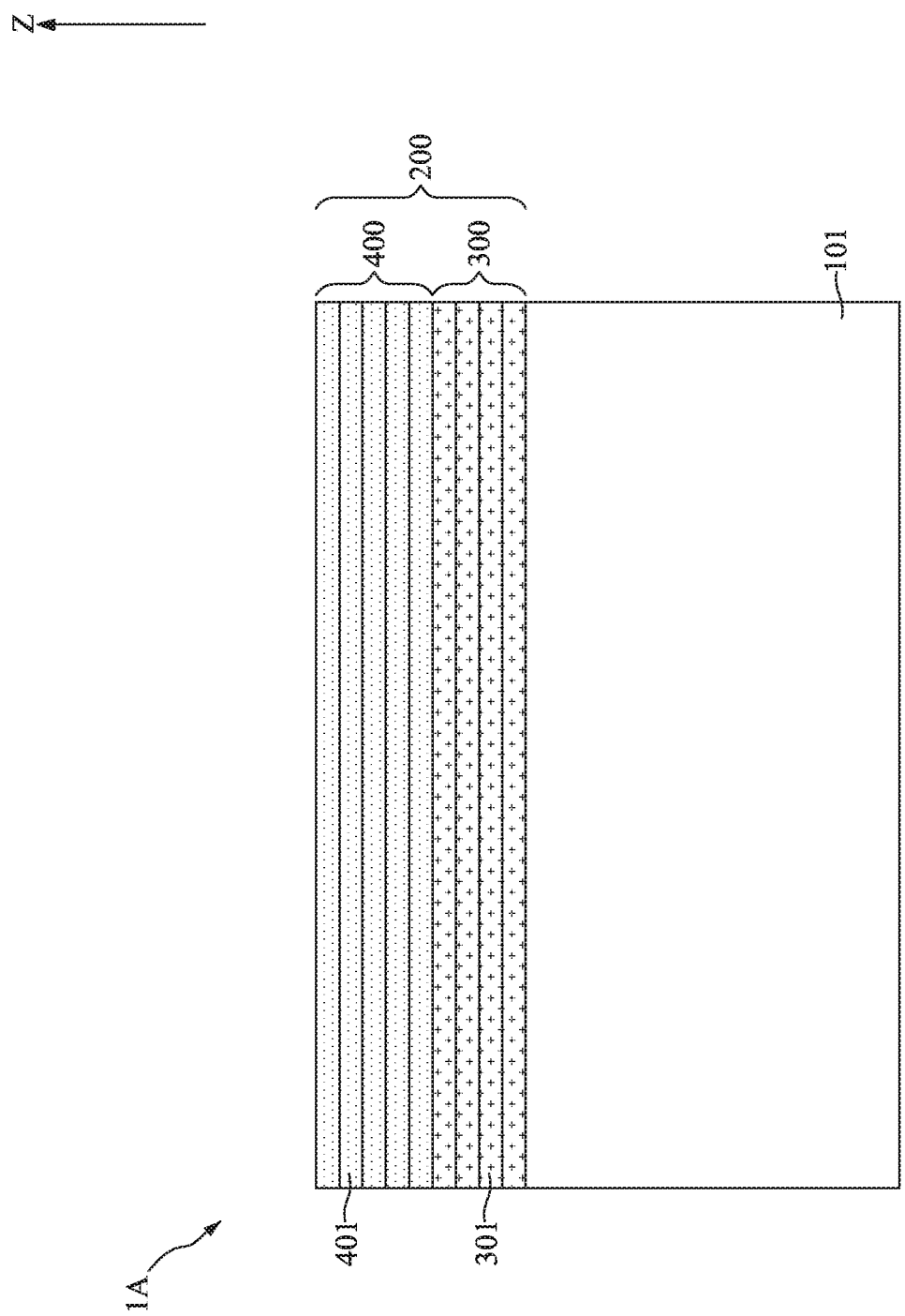
FIG. 4 illustrates, in a schematic cross-sectional view diagram, part of the flow for fabricating the semiconductor device in accordance with one embodiment of the present disclosure.
Figure 5:
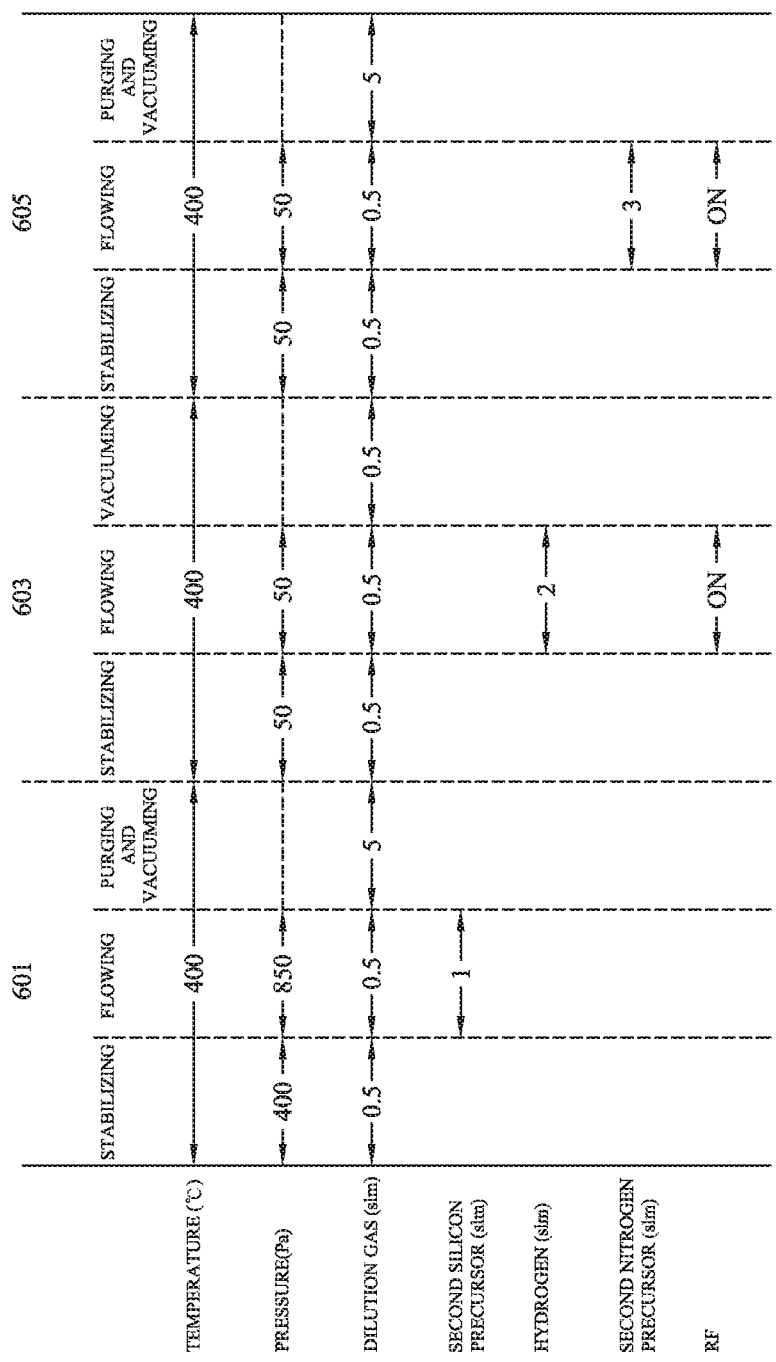
FIG. 5 is a chart showing an example of process conditions for forming a treated silicon nitride film in accordance with one embodiment of the present disclosure.

FIG. 4 illustrates, in a schematic cross-sectional view diagram, part of the flow for fabricating the semiconductor device 1A in accordance with one embodiment of the present disclosure. FIG. 5 is a chart showing an example of process conditions for forming a treated silicon nitride film 400 in accordance with one embodiment of the present disclosure.

With reference to FIGS. 1, 4, and 5, at step S15, a treated silicon nitride film 400 may be formed on the untreated silicon nitride film 300, and the untreated silicon nitride film 300 and the treated silicon nitride film 400 together form a silicon nitride layer 200.

With reference to FIGS. 4 and 5, the treated silicon nitride film 400 may be formed by a second deposition process. The second deposition may be an atomic layer deposition process. The second deposition process may include a second silicon precursor supplying step 601, a first hydrogen radical purging step 603, and a second nitrogen precursor supplying step 605 performed sequentially. In the second silicon precursor supplying step 601, a second silicon precursor may be supplied to the reaction chamber and the chemical species from the second silicon precursor may be adsorbed to the top surface of the untreated silicon nitride film 300 at a single atomic layer level. In the first hydrogen radical purging step 603, hydrogen radicals may be supplied to the reaction chamber to substituted impurities, such as chlorine, contained in the adsorbed chemical species originated from the second silicon precursor. Accordingly, the amount of impurities contained in the adsorbed chemical species originated from the second silicon precursor may be reduced. In the second nitrogen precursor supplying step 605, a second nitrogen precursor may be activated and supplied to the reaction chamber and the chemical species contained in the second nitrogen precursor may react with the adsorbed chemical species originated from the second silicon precursor to form a treated silicon nitride sub-film 401 of a thickness of a single molecule level. The treated silicon nitride sub-film 401 may be formed on the top surface of the untreated silicon nitride film 300.

Specifically, the second silicon precursor supplying step 601 may include a stabilizing stage, a flowing stage, and a purging and vacuuming stage.

With reference to FIGS. 4 and 5, in the stabilizing stage of the second silicon precursor supplying step 601, a dilution gas such as nitrogen gas may be supplied to the reaction chamber. A flow rate of the dilution gas may be between about 0.3 slm and about 0.7 slm. For example, in the embodiment depicted, the flow rate of the dilution gas may be 0.5 slm. A process temperature of the stabilizing stage may be between about 25° C. and about 700° C., between about 50° C. and about 600° C., between about 100° C. and about 500° C., between about 200° C. and about 450° C., or between about 350° C. and about 425° C. For example, in the embodiment depicted, the process temperature of the stabilizing stage may be 400° C. A process pressure of the stabilizing stage may be between about 200 Pa and about 600 Pa, between about 300 Pa and about 500 Pa, or between about 350 Pa and about 450 Pa. For example, the in the present embodiment, the process pressure of the stabilizing stage may be 400 Pa.

With reference to FIGS. 4 and 5, in the flowing stage of the second silicon precursor supplying step 601, the second silicon precursor may be supplied to the reaction chamber while the dilution gas is suppling. The chemical species from the second silicon precursor may be adsorbed to the top surface of the untreated silicon nitride film 300 at a single atomic layer level. In some embodiments, the second silicon precursor may include a halide, such as iodine (I) or chlorine (Cl). In the embodiment depicted, the second silicon precursor may be, for example, dichlorosilane. The reaction between the second silicon precursor and the untreated silicon nitride film 300 may be similar to the reaction between the first silicon precursor and the substrate 101. In some embodiments, the second silicon precursor may include, for example, silicon tetrachloride, trichlorosilane, dichlorosilane, or hexachlorodisilane. In some embodiments, the second silicon precursor may include, for example, silicon tetraiodide, triiododsilane, diiodosilane, iodosilane, disilicon hexaiodide, trisilicon octaiodide, H$_2$Si$_2$I$_4$, H$_3$Si$_2$I$_3$, H$_4$Si$_2$I$_2$, H$_5$Si$_2$I, or HSi$_2$I$_5$. In some embodiments, the second silicon precursor may include one of triiododsilane, diiodosilane, iodosilane, H$_2$Si$_2$I$_4$, H$_4$Si$_2$I$_2$, and H$_5$Si$_2$I. In some embodiments, the second silicon precursor may include two, three, four, five, or six of triiododsilane, diiodosilane, iodosilane, H$_2$Si$_2$I$_4$, H$_4$Si$_2$I$_2$, and H$_5$Si$_2$I, including any combinations thereof.

With reference to FIGS. 4 and 5, in the flowing stage of the second silicon precursor supplying step 601, a flow rate of the second silicon precursor may be between about 1 slm and about 5 slm or between about 3 slm and about 4.5 slm. For example, in the embodiment depicted, the flow rate of the second silicon precursor may be 1 slm. If the flow rate of the second silicon precursor is lower than 1 slm, the amount of the second silicon precursor may be not sufficient to supply to nitrogen atoms on the top surface of the untreated silicon nitride film 300. If the flow rate of the second silicon precursor is greater than 5 slm, an amount of the second silicon precursor may not react with nitrogen atoms on the top surface of the untreated silicon nitride film 300. A flow rate of the dilution gas may be between about 0.3 slm and about 0.7 slm. For example, in the embodiment depicted, the flow rate of the dilution gas may be 0.5 slm.

With reference to FIGS. 4 and 5, in the flowing stage of the second silicon precursor supplying step 601, a process temperature of the flowing stage may be between about 200° C. and about 550° C. For example, in the embodiment depicted, the process temperature of the flowing stage may be 400° C. If the process temperature is lower than 200° C., the chemical species from the second silicon precursor may not be adsorbed to the top surface of the untreated silicon nitride film 300. If the process temperature is greater than 550° C., the reliability of transistor in the substrate 101 may be affected and the thicknesses of resultant silicon nitride layer in zone 3 may be shallower. That is, the thickness uniformity of the resultant silicon nitride layer may be worse. In some embodiments, the process temperature of the flowing stage may be between about 390° C. and about 410° C. By using aforementioned temperature range, the deposition rate may be increased, and various characteristics, such as thickness uniformity, wet-etch resistance property and film stress, of the resultant silicon nitride layer may be improved.

With reference to FIGS. 4 and 5, in the flowing stage of the second silicon precursor supplying step 601, a process pressure of the flowing stage may be between about 400 Pa and about 1200 Pa, between about 600 Pa and about 1100 Pa, or between about 800 Pa and about 1000 Pa. For example, the in the present embodiment, the process pressure of the flowing stage may be 850 Pa. By using aforementioned pressure range, the reaction rate between nitrogen atoms and first silicon precursor may be increased and the pressure may be readily regulated.

With reference to FIGS. 4 and 5, in the purging and vacuuming stage of the second silicon precursor supplying step 601, the supply of the second silicon precursor may be stopped. A flow rate of the dilution gas may be increased to purge the reaction chamber. For example, the flow rate of the dilution gas may be between about 3 slm and about 7 slm. In the embodiment depicted, the flow rate of the dilution gas may be 5 slm.

Specifically, the first hydrogen radical purging step 603 may include a stabilizing stage, a flowing stage, and a vacuuming stage.

With reference to FIGS. 4 and 5, in the stabilizing stage of the first hydrogen radical purging step 603, a dilution gas such as nitrogen gas may be supplied to the reaction chamber. A flow rate of the dilution gas may be between about 0.3 slm and about 0.7 slm. For example, in the embodiment depicted, the flow rate of the dilution gas may be 0.5 slm. A process temperature of the stabilizing stage may be between about 25° C. and about 700° C., between about 50° C. and about 600° C., between about 100° C. and about 500° C., between about 200° C. and about 450° C., or between about 350° C. and about 425° C. For example, in the embodiment depicted, the process temperature of the stabilizing stage may be 400° C. A process pressure of the stabilizing stage may be between about 10 Pa and about 70 Pa, between about 20 Pa and about 60 Pa, or between about 30 Pa and about 50 Pa. For example, the in the present embodiment, the process pressure of the stabilizing stage may be 50 Pa.

With reference to FIGS. 4 and 5, in the flowing stage of the first hydrogen radical purging step 603, a first radical source may be activated in the plasma generating unit and then supplied to the reaction chamber while the dilution gas is suppling. The activated first radical source may be supplied to the reaction chamber to substituted impurities, such as chlorine, contained in the adsorbed chemical species originated from the second silicon precursor. Accordingly, the amount of impurities contained in the adsorbed chemical species originated from the second silicon precursor may be reduced. The first radical source may be, for example, hydrogen gas.

With reference to FIGS. 4 and 5, in the flowing stage of the first hydrogen radical purging step 603, a radio frequency in the plasma generating unit may be turned on to activate the first radical source. A radio frequency power of the flowing stage may be between about 50 W and about 1000 W or between about 100 W and about 300 W. If the radio frequency power of the flowing stage is greater than 1000 W, the quarts walls of the plasma generating unit may be damaged. A radio frequency power density of the flowing stage may be between about 0.02 W/cm$^2$ and about 2.0 W/cm$^2$ or between about 0.05 W/cm$^2$ and about 1.5 W/cm$^2$. The process frequency of the plasma generating unit may be between about 10.00 MHz and about 15.00 MHz. For example, in the embodiment depicted, the process frequency of the plasma generating unit in the flowing stage may be 13.56 MHz. In the embodiment depicted, the activated first radical source may be hydrogen radicals ($H_2$*, H*). The activated first radical source may be supplied to the reaction chamber in the form of plasma.

With reference to FIGS. 4 and 5, in the flowing stage of the first hydrogen radical purging step 603, a flow rate of the activated first radical source may be between about 0.5 slm and about 5 slm or between 1.5 slm and about 2.3 slm. By using the aforementioned flow rate range, the plasma of activated first radical source may be readily generated and the amount of the activated first radical source may be sufficient to substituted impurities contained in the adsorbed chemical species originated from the second silicon precursor. In the embodiment depicted, the flow rate of the activated first nitrogen precursor may be, for example, 2 slm. It should be noted that the dilution gas may be still supplied in the flowing stage and a flow rate of the dilution gas may be between about 0.3 slm and about 0.7 slm. For example, in the embodiment depicted, the flow rate of the dilution gas may be still 0.5 slm.

With reference to FIGS. 4 and 5, in the flowing stage of the first hydrogen radical purging step 603, a process pressure in the plasma generating unit may be between about 70 Pa and about 400 Pa or between about 350 Pa and about 400 Pa. By using the aforementioned process pressure range in the plasma generating unit, the plasma of activated first radical source may be readily generated and the amount of the activated first radical source may be sufficient to substituted impurities contained in the adsorbed chemical species originated from the second silicon precursor. A process pressure in the reaction chamber may be between about 40 Pa and about 100 Pa or between about 50 Pa and about 70 Pa. For example, in the embodiment depicted, the process pressure in the reaction chamber may be 50 Pa.

With reference to FIGS. 4 and 5, in the flowing stage of the first hydrogen radical purging step 603, the substitution reaction between the activated first radical source and the impurities contained in the adsorbed chemical species originated from the second silicon precursor may be shown in Formula 4. In the embodiment depicted, the hydrogen radicals (expressed by "$H_2$" in Formula 4) may substitute the chlorine contained in the chemical species, and the chlorine may be combined with hydrogen radicals to form hydrogen chloride and may be removed. As a result, chlorine concentration in the resultant silicon nitride layer may be lowered, by removing chlorine in the first hydrogen radical purging step 603. Accordingly, the wet etch rate of the resultant silicon nitride layer may be lowered. In other words, the etch resistance property of the resultant silicon nitride layer may be improved.

—NH$_2$+SiH$_2$Cl+H$_2$→—NH—SiH$_3$+HCl↑ 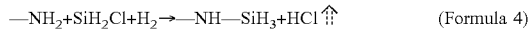 (Formula 4)

With reference to FIGS. 4 and 5, in the vacuuming stage of the first hydrogen radical purging step 603, the supply of the first radical source may be stopped and the radio frequency of the plasma generating unit may be turned off. The dilution gas may be still supplied to the reaction chamber. A flow rate of the dilution gas may be between about 0.3 slm and about 0.7 slm. In the embodiment depicted, the flow rate of the dilution gas may be 0.5 slm.

Specifically, the second nitrogen precursor supplying step 605 may include a stabilizing stage, a flowing stage, and a purging and vacuuming stage.

With reference to FIGS. 4 and 5, in the stabilizing stage of the second nitrogen precursor supplying step 605, a dilution gas such as nitrogen gas may be supplied to the reaction chamber. A flow rate of the dilution gas may be between about 0.3 slm and about 0.7 slm. For example, in the embodiment depicted, the flow rate of the dilution gas may be 0.5 slm. A process temperature of the stabilizing stage may be between about 25° C. and about 700° C., between about 50° C. and about 600° C., between about 100° C. and about 500° C., between about 200° C. and about 450° C., or between about 350° C. and about 425° C. For example, in the embodiment depicted, the process temperature of the stabilizing stage may be 400° C. A process pressure of the stabilizing stage may be between about 10 Pa and about 70 Pa, between about 20 Pa and about 60 Pa, or between about 30 Pa and about 50 Pa. For example, the in the present embodiment, the process pressure of the stabilizing stage may be 50 Pa.

In some embodiments, two of the stage of the second deposition process may overlap or be combined. For example, the vacuuming stage of the first hydrogen radical purging step 603 and the stabilizing stage of the second nitrogen precursor supplying step 605 may be partially or completely overlapped.

With reference to FIGS. 4 and 5, in the flowing stage of the second nitrogen precursor supplying step 605, the second nitrogen precursor may be activated in the plasma generating unit and then supplied to the reaction chamber while the dilution gas is suppling. The chemical species contained in the activated second nitrogen precursor may react with the adsorbed chemical species originated from the second silicon precursor to form the treated silicon nitride sub-film 401 on the top surface of the untreated silicon nitride film 300. The second nitrogen precursor may be, for example, ammonia gas.

With reference to FIGS. 4 and 5, in the flowing stage of the second nitrogen precursor supplying step 605, a radio frequency in the plasma generating unit may be turned on to activate the second nitrogen precursor. A radio frequency power of the flowing stage may be between about 50 W and about 1000 W or between about 100 W and about 300 W. If the radio frequency power of the flowing stage is greater than 1000 W, the quarts walls of the plasma generating unit may be damaged. A radio frequency power density of the flowing stage may be between about 0.02 W/cm$^2$ and about 2.0 W/cm$^2$ or between about 0.05 W/cm$^2$ and about 1.5 W/cm$^2$. The process frequency of the plasma generating unit may be between about 10.00 MHz and about 15.00 MHz. For example, in the embodiment depicted, the process frequency of the plasma generating unit in the flowing stage may be 13.56 MHz. In the embodiment depicted, the activated second nitrogen precursors may be ammonia radicals (NH$_3$*). The activated second nitrogen precursor may be supplied to the reaction chamber in the form of plasma.

With reference to FIGS. 4 and 5, in the flowing stage of the second nitrogen precursor supplying step 605, a flow rate of the activated second nitrogen precursor may be between about 0.5 slm and about 5 slm or between 3 slm and about 5 slm. By using the aforementioned flow rate range, the plasma of activated second nitrogen precursor may be readily generated and the amount of the activated second nitrogen precursor may be sufficient to react with the adsorbed chemical species originated from the second silicon precursor. In the embodiment depicted, the flow rate of the activated second nitrogen precursor may be, for example, 3 slm. It should be noted that the dilution gas may be still supplied in the flowing stage and a flow rate of the dilution gas may be between about 0.3 slm and about 0.7 slm. For example, in the embodiment depicted, the flow rate of the dilution gas may be still 0.5 slm.

With reference to FIGS. 4 and 5, in the flowing stage of the second nitrogen precursor supplying step 605, a process pressure in the reaction chamber may be between about 40 Pa and about 100 Pa or between about 50 Pa and about 70 Pa. For example, in the embodiment depicted, the process pressure in the reaction chamber may be 50 Pa. A process pressure in the plasma generating unit may be between about 70 Pa and about 600 Pa or between about 280 Pa and about 330 Pa. By using the aforementioned process pressure range in the plasma generating unit, the plasma of activated second nitrogen precursor may be readily generated and the amount of the activated second nitrogen precursor may be sufficient to react with the adsorbed chemical species originated from the second silicon precursor.

With reference to FIGS. 4 and 5, in the flowing stage of the second nitrogen precursor supplying step 605, the surface reaction between the activated second nitrogen precursor and the adsorbed chemical species originated from the second silicon precursor may be shown in Formula 5. The treated silicon nitride sub-film 401 consisting of —NH—SiH$_2$(NH$_2$) may be formed after the surface reaction.

—NH—SiH$_3$+NH$_3$*→—NH—SiH$_2$(NH$_2$)+H$_2$↑  (Formula 5)

With reference to FIGS. 4 and 5, in the purging and vacuuming stage of the second nitrogen precursor supplying step 605, the supply of the second nitrogen precursor may be stopped and the radio frequency of the plasma generating unit may be turned off. A flow rate of the dilution gas may be increased to purge the reaction chamber. For example, the flow rate of the dilution gas may be between about 3 slm and about 7 slm. In the embodiment depicted, the flow rate of the dilution gas may be 5 slm.

After the first deposition process, one layer of the treated silicon nitride sub-film 401 may be formed. The second deposition process may be repeated for plural times (only shown four times for clarity) to form layers of the treated silicon nitride sub-film 401 of desired thickness. The layers of the treated silicon nitride sub-film 401 together form the treated silicon nitride film 400. In some embodiments, the repeat times of the second deposition process may be between about 5 and about 35, between about 10 and about 30, or between about 13 and 20. The untreated silicon nitride film 300 and the treated silicon nitride film 400 may together form the silicon nitride layer 200 on the substrate 101.

In some embodiments, the silicon to nitrogen ratio of the silicon nitride layer 200, which excluding hydrogen or other impurities, can be represented as SiN$_x$. The x may be between about 0.5 and about 2.0, between about 0.9 and 1.7, between about 1.0 and about 1.5, or between about 1.2 and 1.4.

Due to that the first hydrogen radical purging step 603 may remove impurities contained in the adsorbed chemical species originated from the second silicon precursor, the impurity concentration (i.e., chlorine concentration) of the treated silicon nitride film 400 may be lower than the impurity concentration of the untreated silicon nitride film 300. As a result, the result silicon nitride layer 200 may have a high film stress and greater wet etch resistance property.

In addition, the composition of the silicon nitride layer 200 may be readily controlled by changing the number of repetition of the first deposition process and the second deposition, and thus the stress of the silicon nitride layer 200 may be also readily controlled.

In some embodiments, the stress-controlled silicon nitride layer 200 may be suitable for use in connection with the fabrication of, for example, field effect transistors, dynamic random access memories, flash memories, static random access memories, advanced image sensors based on complementary metal oxide semiconductor structures, advanced light emitting diode structures, and the like.

In some embodiments, the dilution gas may be, for example, nitrogen gas, argon gas, or helium gas. The first silicon precursor, the first nitrogen precursor, the second silicon precursor, the second nitrogen precursor, or the first radical source may be supplied with the aid of the dilution gas. The dilution gas may also serve as purge gas to purge excess precursors and byproducts.

Figure 6:
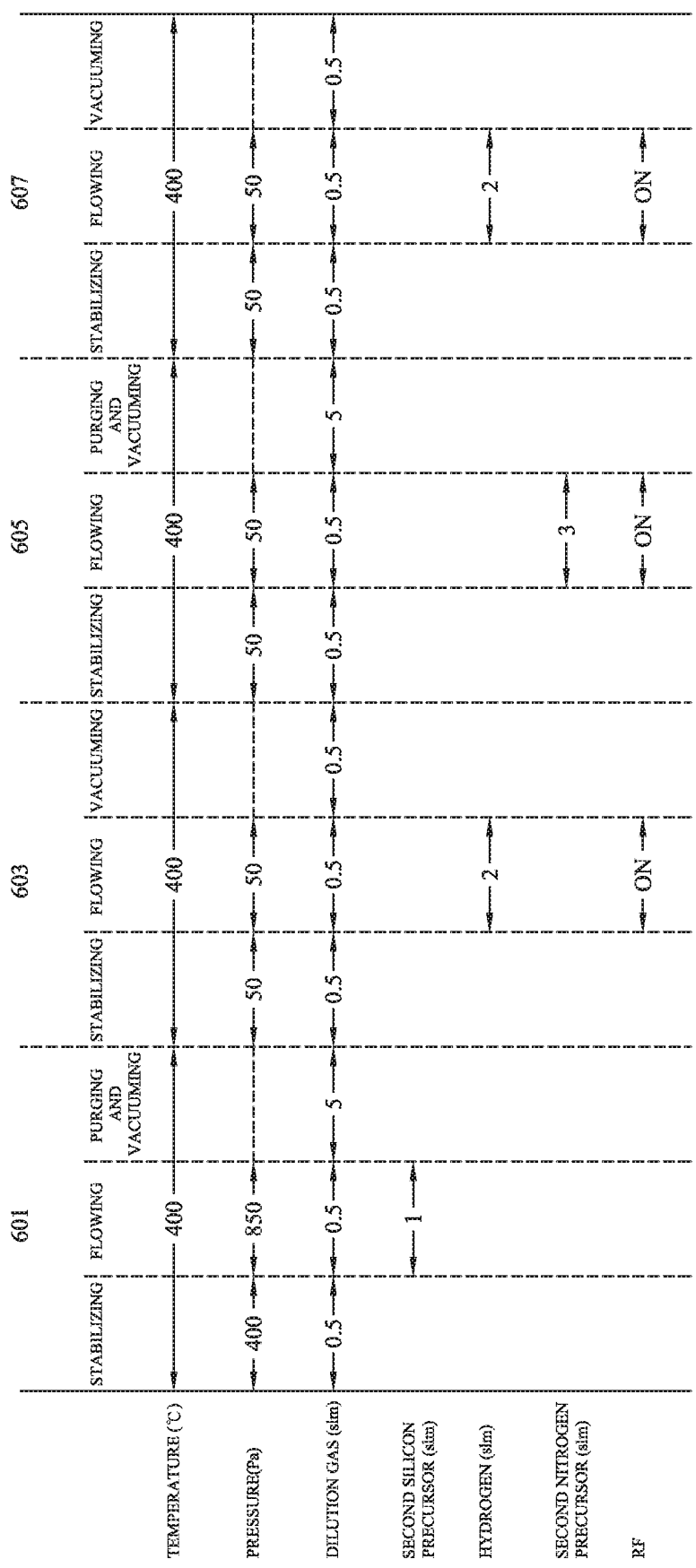
FIG. 6 is a chart showing an example of process conditions for forming a treated silicon nitride film in accordance with another embodiment of the present disclosure.

FIG. 6 is a chart showing an example of process conditions for forming a treated silicon nitride film in accordance with another embodiment of the present disclosure.

With reference to FIG. 6, the silicon nitride layer may be formed with a procedure similar to that illustrated in FIGS. 1 to 5 with similar process conditions. The difference is that the second deposition process may further include a second hydrogen radical purging step 607 after the second nitrogen precursor supplying step 605. The second hydrogen radical purging step 607 may further reduce the impurity concentration of the resultant silicon nitride layer.

Specifically, the second hydrogen radical purging step 607 may include a stabilizing stage, a flowing stage, and a vacuuming stage. Each of the aforementioned stages may have process conditions similar to the corresponding stages of the first hydrogen radical purging step 603.

It should be understood that the same or similar reference numbers used throughout the drawings are used to denote the same or similar features, elements, or structures, and thus, a detailed explanation of the same or similar features, elements, or structures will not be repeated for each of the drawings.

Figure 7:
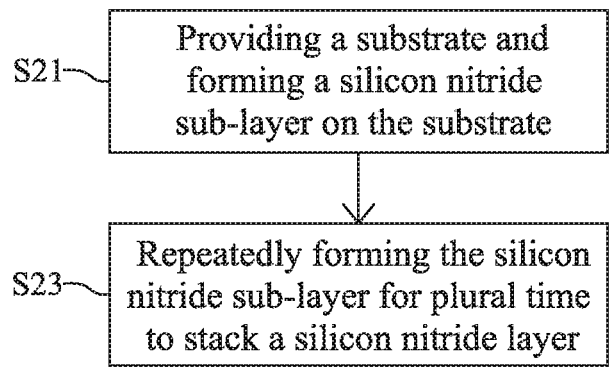
FIG. 7 illustrates, in a flowchart diagram form, a method for fabricating a semiconductor device in accordance with another embodiment of the present disclosure.
Figure 8:
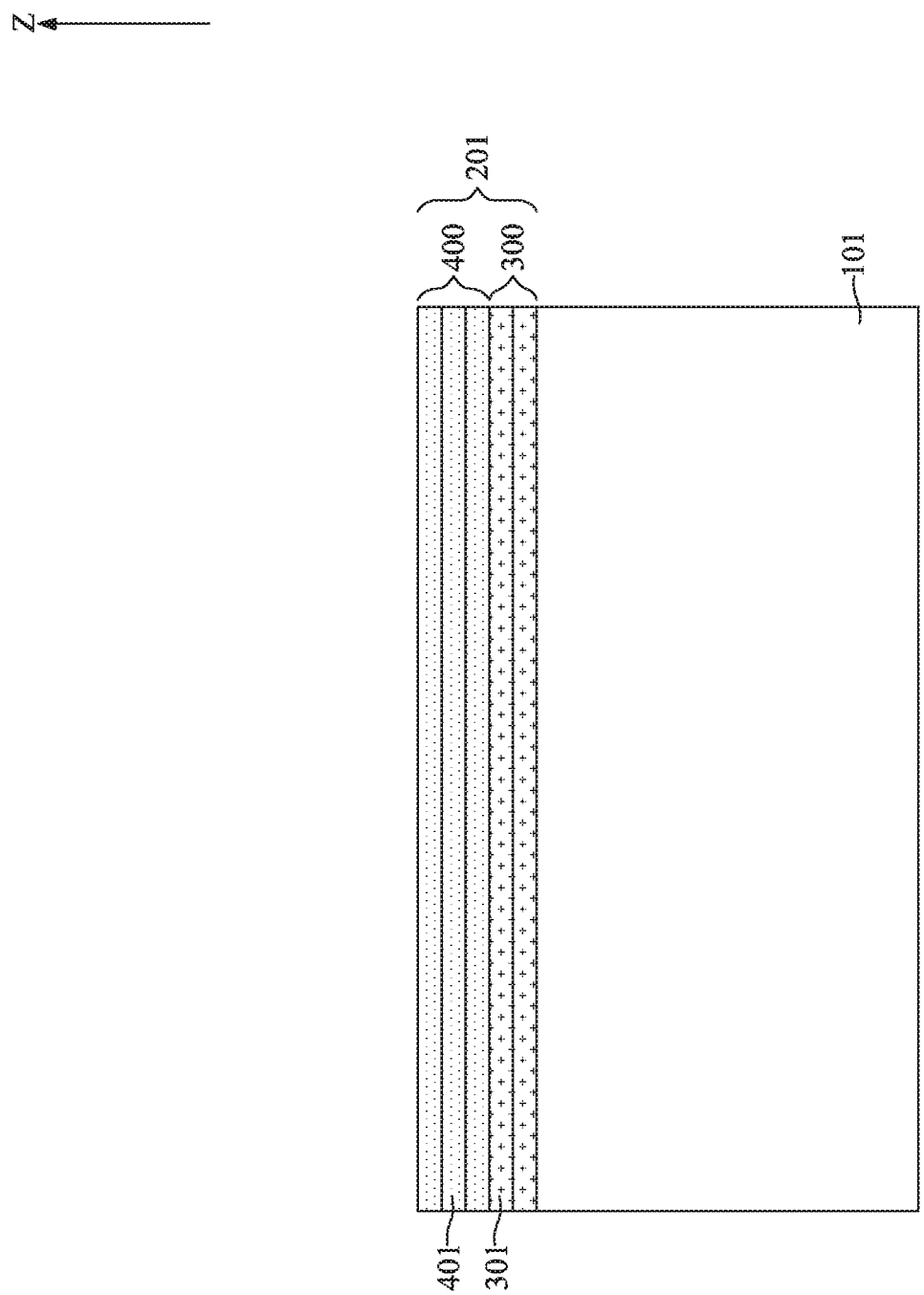
FIGS. 8 and 9 illustrate, in schematic cross-sectional view diagrams, part of a flow for fabricating the semiconductor device in accordance with another embodiment of the present disclosure.
Figure 9:
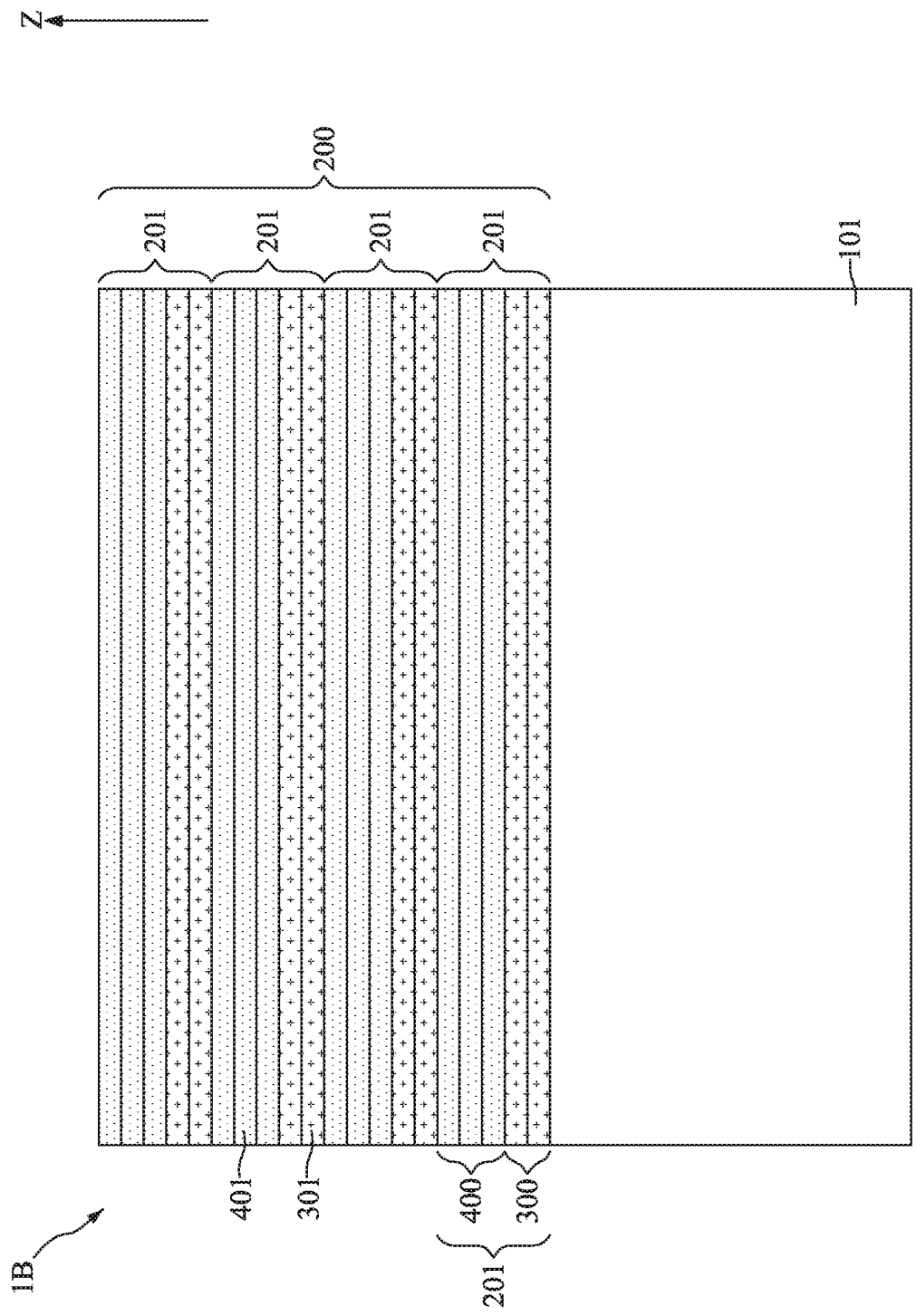

FIG. 7 illustrates, in a flowchart diagram form, a method 20 for fabricating a semiconductor device 1B in accordance with another embodiment of the present disclosure. FIGS. 8 and 9 illustrate, in schematic cross-sectional view diagrams, part of a flow for fabricating the semiconductor device 1B in accordance with another embodiment of the present disclosure.

With reference to FIGS. 7 and 8, at step S21, a substrate 101 may be provided, and a silicon nitride sub-layer 201 may be formed on the substrate 101 by a third deposition process.

With reference to FIG. 8, the third deposition process may include forming an untreated silicon nitride film 300 on the substrate 101 and forming a treated silicon nitride film 400 on the untreated silicon nitride film 300. The untreated silicon nitride film 300 and the treated silicon nitride film 400 together form the silicon nitride sub-layer 201.

With reference to FIG. 8, the untreated silicon nitride film 300 may be formed by the same first deposition process as illustrated in FIGS. 1 to 5 with same process conditions. The number of repetition of the first deposition process may be two to form two layers of the untreated silicon nitride sub-film 301 which together form the untreated silicon nitride film 300.

With reference to FIG. 8, the treated silicon nitride film 400 may be formed by the same second deposition process as illustrated in FIGS. 1 to 5 with same process conditions. The number of repetition of the second deposition process may be three to form three layers of the treated silicon nitride sub-film 401 which together form the treated silicon nitride film 400.

With reference to FIGS. 7 and 9, at step S23, the silicon nitride sub-layer 201 may be repeatedly formed for plural time to stack a silicon nitride layer 200 on the substrate 101.

With reference to FIG. 9, the third process may be repeated for plural times (only shown four times for clarity) to form layers of the silicon nitride sub-layer 201 of desired thickness. The layers of the silicon nitride sub-layer 201 together form the silicon nitride layer 200.

FIGS. 10 to 15 illustrate, in schematic cross-sectional view diagrams, semiconductor device 1C, 1D, 1E, 1F, 1G, and 1H in accordance with some embodiments of the present disclosure.

Figure 10:
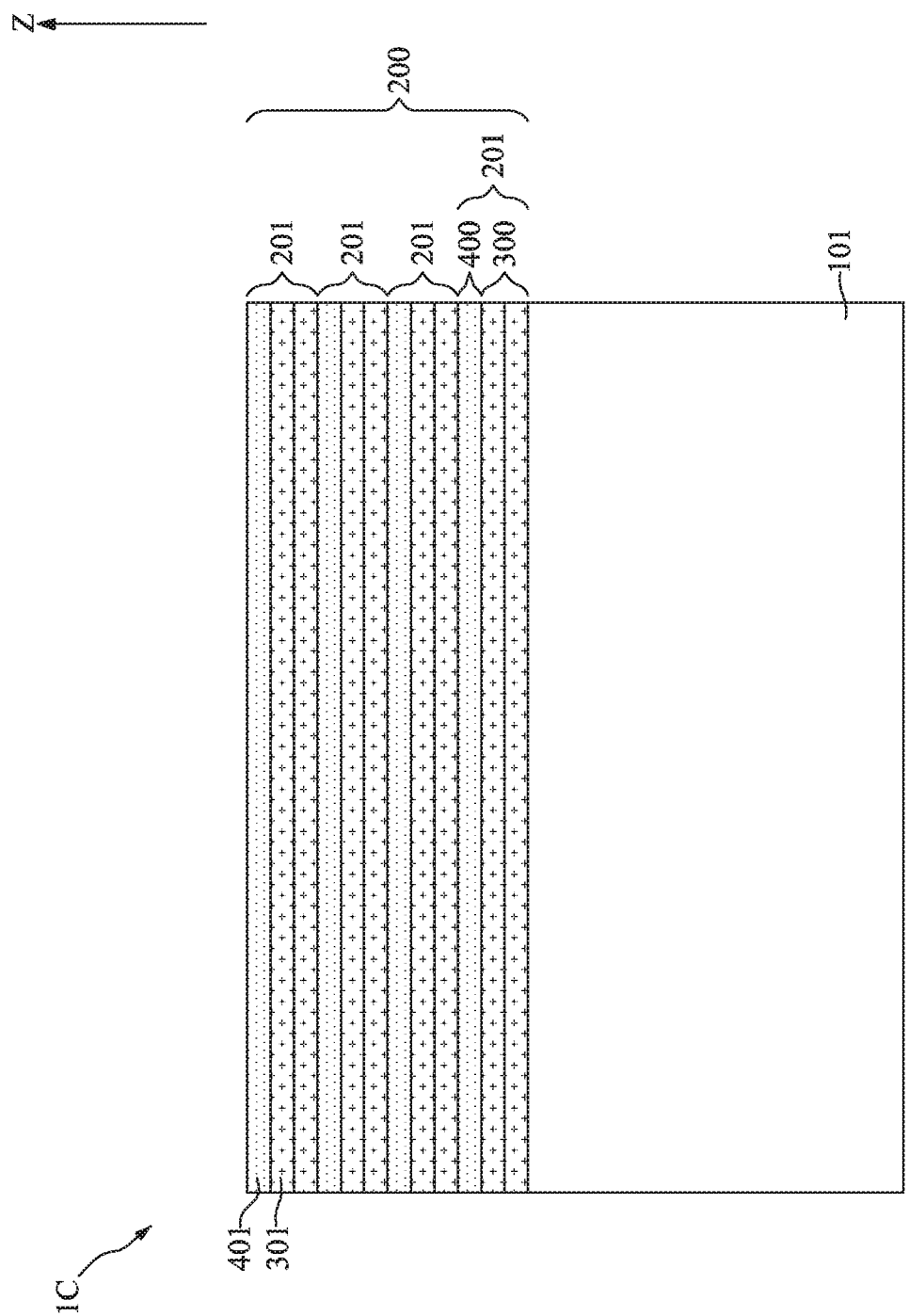

With reference to FIG. 10, the semiconductor device 1C may be formed with a procedure similar to that illustrated in FIGS. 7 to 9. The number of repetition of the first deposition process may be two to form two layers of the untreated silicon nitride sub-film 301 which together form the untreated silicon nitride film 300. The number of repetition of the second deposition process may be one to form one layer of the treated silicon nitride sub-film 401 which may be referred to as the treated silicon nitride film 400.

Figure 11:
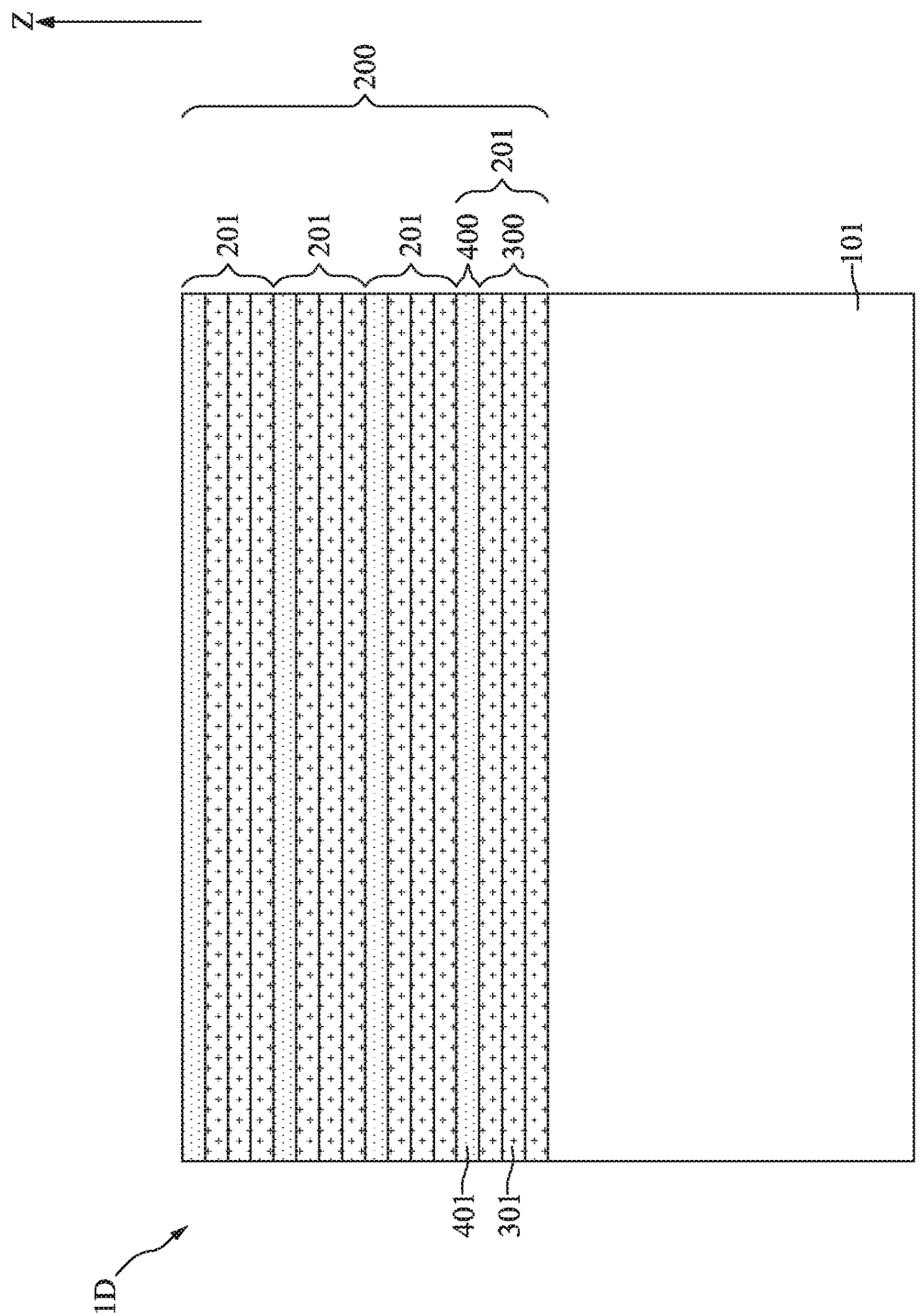

With reference to FIG. 11, the semiconductor device 1D may be formed with a procedure similar to that illustrated in FIGS. 7 to 9. The number of repetition of the first deposition process may be three to form three layers of the untreated silicon nitride sub-film 301 which together form the untreated silicon nitride film 300. The number of repetition of the second deposition process may be one to form one layer of the treated silicon nitride sub-film 401 which may be referred to as the treated silicon nitride film 400.

Figure 12:
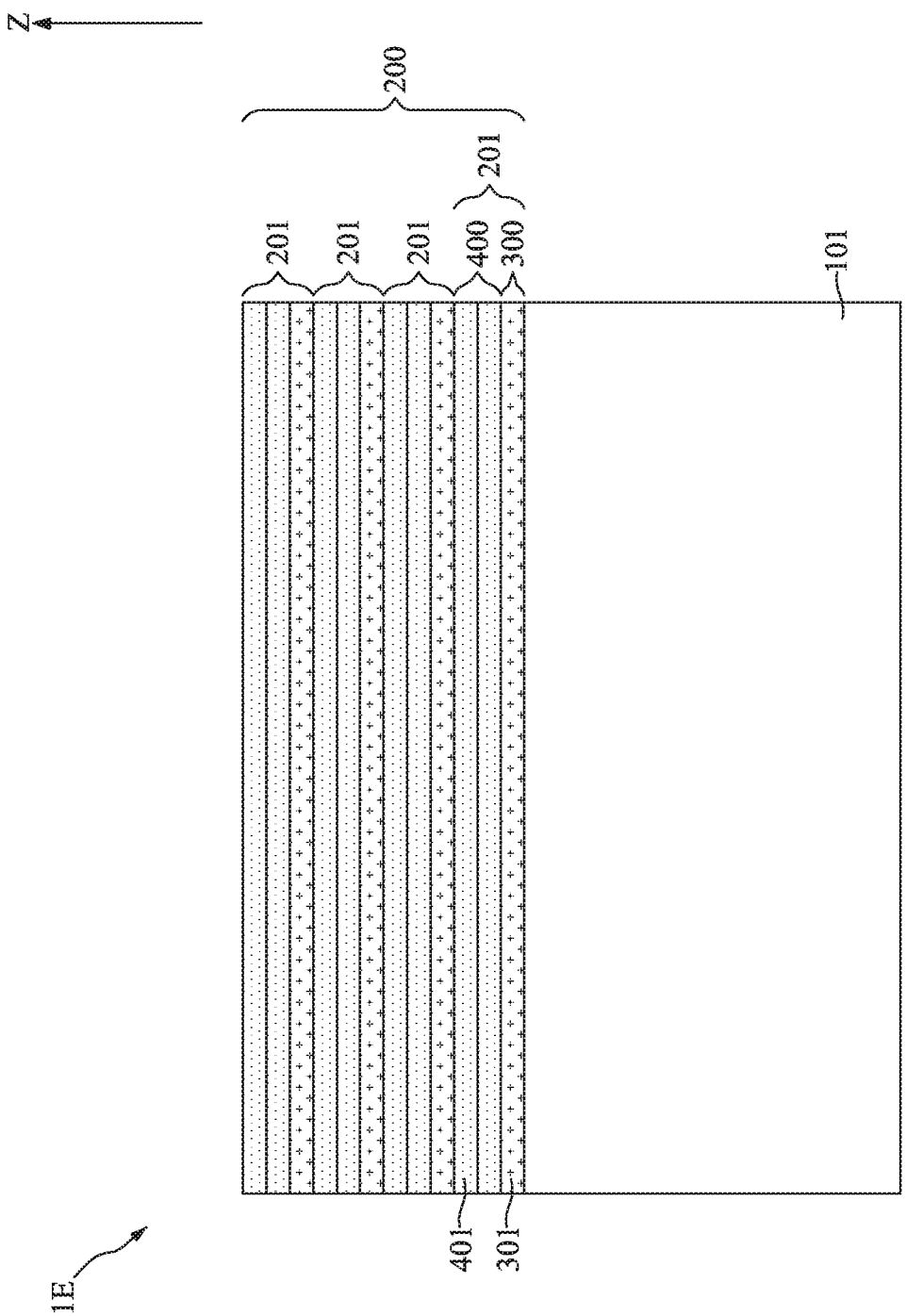

With reference to FIG. 12, the semiconductor device 1E may be formed with a procedure similar to that illustrated in FIGS. 7 to 9. The number of repetition of the first deposition process may be one to form one layer of the untreated silicon nitride sub-film 301 which may be referred to as the untreated silicon nitride film 300. The number of repetition of the second deposition process may be two to form two layers of the treated silicon nitride sub-film 401 which together form the treated silicon nitride film 400.

Figure 13:
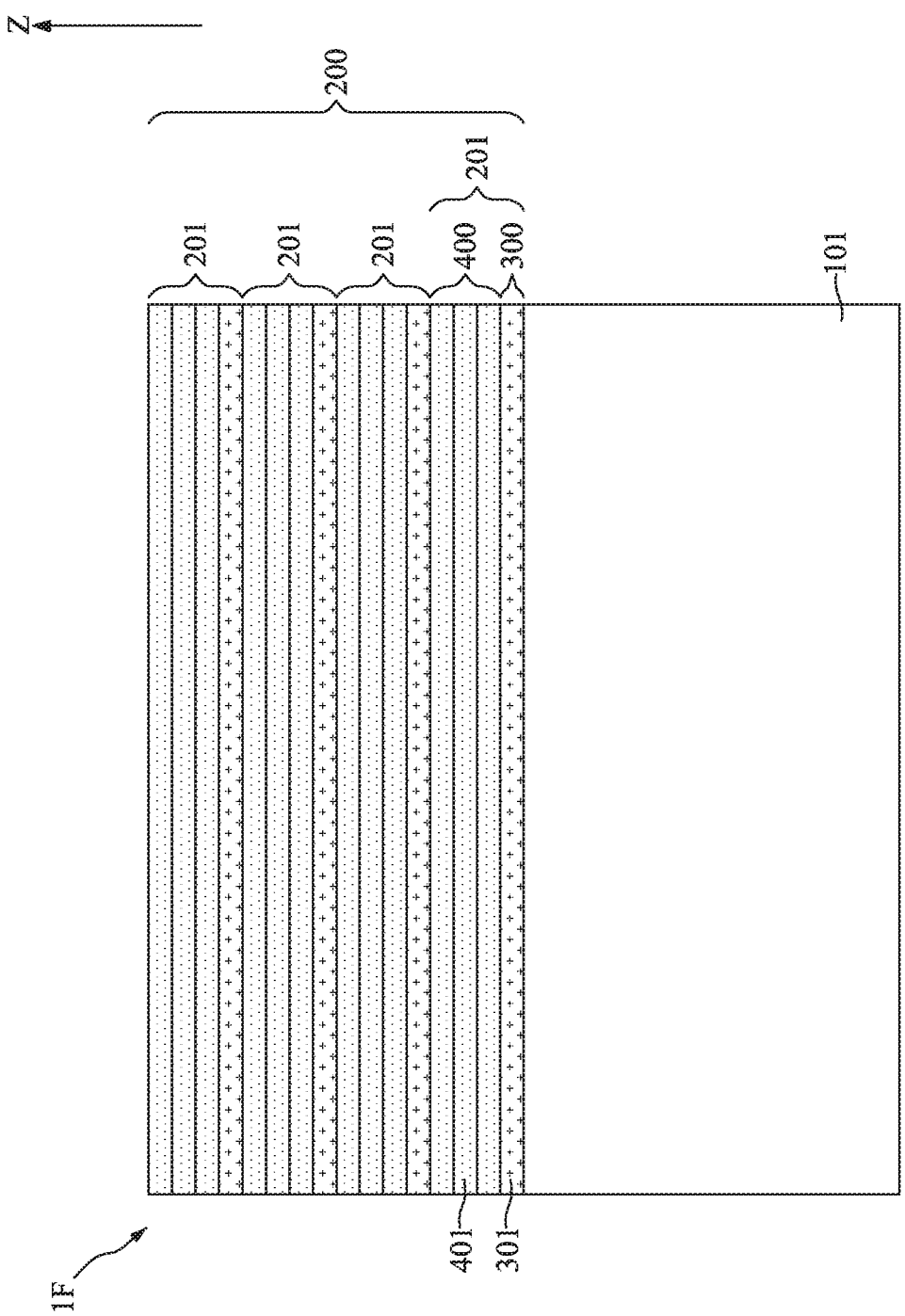

With reference to FIG. 13, the semiconductor device 1F may be formed with a procedure similar to that illustrated in FIGS. 7 to 9. The number of repetition of the first deposition process may be one to form one layer of the untreated silicon nitride sub-film 301 which may be referred to as the untreated silicon nitride film 300. The number of repetition of the second deposition process may be three to form three layers of the treated silicon nitride sub-film 401 which together form the treated silicon nitride film 400.

Figure 14:
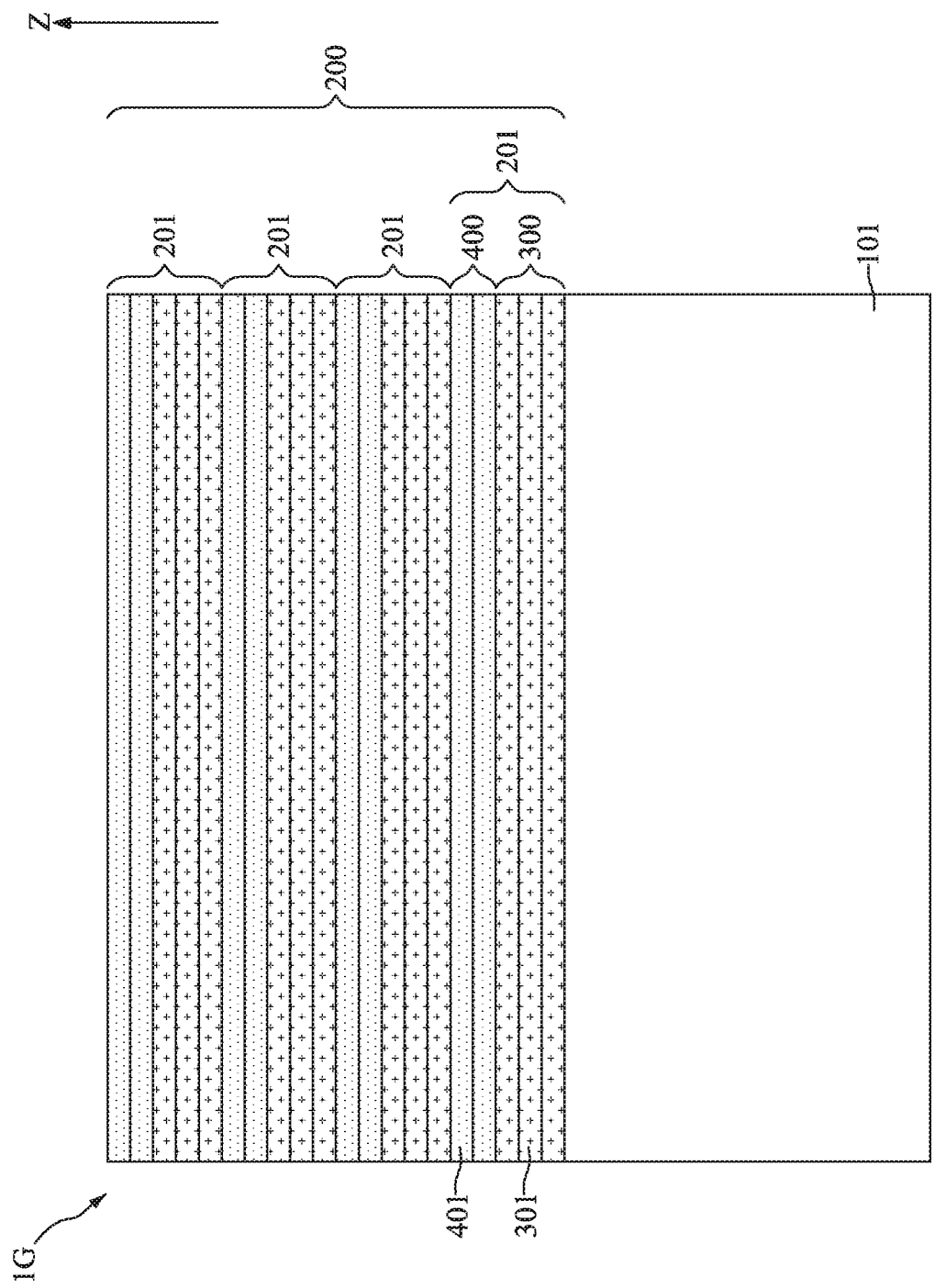

With reference to FIG. 14, the semiconductor device 1G may be formed with a procedure similar to that illustrated in FIGS. 7 to 9. The number of repetition of the first deposition process may be three to form three layers of the untreated silicon nitride sub-film 301 which together form the untreated silicon nitride film 300. The number of repetition of the second deposition process may be two to form two layers of the treated silicon nitride sub-film 401 which together form the treated silicon nitride film 400.

With reference to FIG. 15, the semiconductor device 1H may be formed with a procedure similar to that illustrated in FIGS. 7 to 9. The number of repetition of the first deposition process may be one to form one layer of the untreated silicon nitride sub-film 301 which may be referred to as the untreated silicon nitride film 300. The number of repetition of the second deposition process may be one to form one layer of the treated silicon nitride sub-film 401 which may be referred to as the treated silicon nitride film 400.

Due to the design of the semiconductor device of the present disclosure, the impurity concentration of the resultant silicon nitride layer 200 may be reduced. Accordingly, the wet etch resistance property of the silicon nitride layer 200 may be improved. As a result, the yield, the quality, and the reliability of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   providing a substrate in a reaction chamber;
   forming an untreated silicon nitride film on the substrate; and
   forming a treated silicon nitride film on the untreated silicon nitride film;
   wherein forming the untreated silicon nitride film comprises the steps of:
   (a) supplying a first silicon precursor into the reaction chamber, thereby allowing chemical species from the first silicon precursor to be adsorbed on the substrate; and
   (b) supplying a first nitrogen precursor into the reaction chamber, thereby nitriding the chemical species to deposit resultant silicon nitride on the substrate;
   wherein the step (a) and the step (b) are sequentially and repeatedly performed to form the untreated silicon nitride film;
   wherein forming the treated silicon nitride film comprises the steps of:
   (c) supplying a second silicon precursor into the reaction chamber, thereby allowing chemical species from the second silicon precursor to be adsorbed on the untreated silicon nitride film formed after the step (a) and step (b);
   (d) performing a first hydrogen radical purging by supplying hydrogen radicals into the reaction chamber to reduce impurities in the chemical species from the second silicon precursor; and
   (e) supplying a second nitrogen precursor into the reaction chamber, thereby nitriding the chemical species from the second silicon precursor to deposit resultant silicon nitride on the untreated silicon nitride film;
   wherein the step (c), the step (d), and the step (e) are sequentially and repeatedly performed to form the treated silicon nitride film deposited on the untreated silicon nitride film;
   wherein the untreated silicon nitride film and the treated silicon nitride film together form a silicon nitride layer, wherein a first impurity concentration of the treated silicon nitride film deposited on the untreated silicon nitride film is lower than a second impurity concentration of the untreated silicon nitride film deposited under the treated silicon nitride film.

2. The method for fabricating the semiconductor device of claim 1, wherein the first silicon precursor and the second silicon precursor are dichlorosilane.

3. The method for fabricating the semiconductor device of claim 2, wherein the first nitrogen precursor and the second nitrogen precursor are ammonia gas.

4. The method for fabricating the semiconductor device of claim 3, wherein the hydrogen radicals in step (d) are generated in a plasma generating unit by supplying hydrogen gas thereto.

5. The method for fabricating the semiconductor device of claim 4, wherein the step (d) comprises a stabilizing stage, a flowing stage, and a vacuuming stage.

6. The method for fabricating the semiconductor device of claim 5, wherein a process pressure in the reaction chamber is between about 40 Pa and about 100 Pa during the flowing stage of the step (d).

7. The method for fabricating the semiconductor device of claim 6, wherein a process pressure in the plasma generating unit is between about 70 Pa and about 400 Pa during the flowing stage of step (d).

8. The method for fabricating the semiconductor device of claim 7, wherein a flow rate of the hydrogen radicals is between about 0.5 slm and about 5 slm during the flowing stage of the step (d).

9. The method for fabricating the semiconductor device of claim 8, wherein a process frequency of the plasma generating unit is between about 10.00 MHz and about 15.00 MHz during the flowing stage of the step (d).

10. The method for fabricating the semiconductor device of claim 9, wherein forming the treated silicon nitride film further comprises a step (f) performing a second hydrogen radical purging by supplying hydrogen radicals into the reaction chamber.

11. A method for fabricating a semiconductor device, comprising:
    providing a substrate in a reaction chamber; and
    forming a silicon nitride layer on the substrate by sequentially and repeatedly forming an untreated silicon nitride film and a treated silicon nitride film for plural times;
    wherein a first impurity concentration of the treated silicon nitride film deposited on the untreated silicon nitride film is lower than a second impurity concentration of the untreated silicon nitride film deposited under the treated silicon nitride film;

wherein forming the untreated silicon nitride film and the treated silicon nitride film comprises the steps of:

(a) supplying a first silicon precursor into the reaction chamber, thereby allowing chemical species from the first silicon precursor to be adsorbed on the substrate;

(b) supplying a first nitrogen precursor into the reaction chamber, thereby nitriding the chemical species to deposit resultant silicon nitride on the substrate;

(c) sequentially and repeatedly performing the step (a) and the step (b) to form the untreated silicon nitride film;

(d) supplying a second silicon precursor into the reaction chamber, thereby allowing chemical species from the second silicon precursor to be adsorbed on the untreated silicon nitride film formed after the step (c);

(e) performing a first hydrogen radical purging by supplying hydrogen radicals into the reaction chamber to reduce impurities in the chemical species from the second silicon precursor;

(f) supplying a second nitrogen precursor into the reaction chamber, thereby nitriding the chemical species from the second silicon precursor to deposit resultant silicon nitride on the untreated silicon nitride film; and (g) sequentially and repeatedly performing the step (d), the step (e), and the step (f) to form the treated silicon nitride film deposited on the untreated silicon nitride film.

12. The method for fabricating the semiconductor device of claim 11, wherein the first silicon precursor and the second silicon precursor are dichlorosilane.

13. The method for fabricating the semiconductor device of claim 12, wherein the first nitrogen precursor and the second nitrogen precursor are ammonia gas.

14. The method for fabricating the semiconductor device of claim 13, wherein the hydrogen radicals in step (e) are generated in a plasma generating unit by supplying hydrogen gas thereto.

15. The method for fabricating the semiconductor device of claim 14, wherein the step (a) comprises a stabilizing stage, a flowing stage, and a purging and vacuuming stage.

16. The method for fabricating the semiconductor device of claim 15, wherein a process temperature is between 200° C. and about 550° C. during the flowing stage of the step (a).

17. The method for fabricating the semiconductor device of claim 16, wherein a flow rate of the first silicon precursor is between about 1 slm and about 5 slm during the flowing stage of the step (a).

18. The method for fabricating the semiconductor device of claim 17, wherein a process pressure is between about 400 Pa and about 1200 Pa during the flowing stage of the step (a).

19. The method for fabricating the semiconductor device of claim 18, wherein the step (b) comprises a stabilizing stage, a flowing stage, and a purging and vacuuming stage.

20. The method for fabricating the semiconductor device of claim 19, wherein a process frequency of the plasma generating unit is between about 10.00 MHz and about 15.00 MHz during the flowing stage of the step (b).

* * * * *